US006528987B1

(12) United States Patent
Blake et al.

(10) Patent No.: US 6,528,987 B1
(45) Date of Patent: Mar. 4, 2003

(54) METHOD AND APPARATUS FOR DETERMINING FAN SPEED

(75) Inventors: John Blake, Limerick (IE); David Hanrahan, Waterford (IE); Kohji Yoshida, Oomiya (JP)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/595,953

(22) Filed: Jun. 19, 2000

(51) Int. Cl.[7] ............................................... G01P 3/489
(52) U.S. Cl. ....................... 324/168; 324/511; 324/537; 318/463
(58) Field of Search ................................. 324/511, 510, 324/515, 537, 168; 318/471, 463; 363/96

(56) References Cited

U.S. PATENT DOCUMENTS

| | | | | |
|---|---|---|---|---|
| 4,903,188 A | * | 2/1990 | Mahadevan et al. | 363/96 |
| 4,977,375 A | * | 12/1990 | Toth | 324/511 |
| 5,727,928 A | * | 3/1998 | Brown | 417/44.11 |
| 6,009,362 A | * | 12/1999 | Furukawa | 701/29 |
| 6,040,668 A | * | 3/2000 | Huynh et al. | 318/471 |
| 6,163,266 A | * | 12/2000 | Fasullo et al. | 340/664 |
| 6,182,232 B1 | * | 1/2001 | Klein | 713/340 |
| 6,182,902 B1 | * | 2/2001 | Shih | 236/35 |
| 6,188,189 B1 | * | 2/2001 | Blake | 318/471 |
| 6,191,546 B1 | * | 2/2001 | Baush et al. | 318/471 |
| 6,219,795 B1 | * | 4/2001 | Klein | 713/300 |
| 6,262,549 B1 | * | 7/2001 | Yang et al. | 318/490 |
| 6,271,638 B1 | * | 8/2001 | Erdman et al. | 318/349 |
| 6,400,113 B1 | * | 6/2002 | Garcia et al. | 318/463 |

* cited by examiner

Primary Examiner—N. Le
Assistant Examiner—T. R. Sundaram
(74) Attorney, Agent, or Firm—Wolf, Greenfield & Sacks, PC

(57) ABSTRACT

An operating circuit (1) for controlling the speed of a cooling fan motor (3) for computer cabinetry (7), and for determining an under-speed condition in the fan motor (3) comprises a control circuit (15) which controls a variable output signal generator circuit (18) for outputting a pulse width modulated signal corresponding to the desired fan speed for switching a switching circuit (8) in a power supply circuit of the fan motor (3) for pulse width modulating the power supply to the fan motor (3). A monitoring resistor (R1), a capacitor (C1) and a circuit (12) provides a tachometer signal to the operating circuit (1). A gate circuit (22) gates the second and fourth pulses of the tachometer signal to a counter (20) which counts clock pulses from a clock signal generating circuit (19) between the rising edges of the second and fourth pulses which are in turn stored in a register (23) for comparison with a reference count by a comparator (25). The comparator (25) outputs an alert signal in the event of the count in the register (23) exceeding the reference count indicating under-speed of the fan. The control circuit (15) controls the signal generator circuit (18) for holding the pulse width modulated signal outputted to the switching circuit (8) on during a duty cycle between the rising edges of the second and fourth pulses of the tachometer signal so that the tachometer signal remains available until the fan speed has been determined.

43 Claims, 2 Drawing Sheets

METHOD AND APPARATUS FOR DETERMINING FAN SPEED

FIELD OF THE INVENTION

The present invention relates to a method and apparatus for determining a performance characteristic of a fan, and in particular, though not limited to a method and apparatus for determining the speed of a cooling fan in an enclosure for electronic circuitry.

BACKGROUND TO THE INVENTION

Computers comprise a cabinet within which the electronic components of the computer are housed. Some of these components, for example, the central processing unit and the power supply module operate at relatively high temperatures, thus generating significant quantities of heat. One or more cooling fans are provided in such computer cabinets for circulating air and for changing air within the computer cabinet for maintaining the temperature within the cabinet within an acceptable temperature range. In order to minimise acoustic noise and power consumption such fans are only operated when the temperature exceeds an upper limit of the acceptable temperature range. More recently variable speed control techniques have been developed for operating the fans at various speeds, depending on the temperature within the computer cabinet. One of the more recent variable speed control techniques which have been developed is based on pulse width modulation of the power supply to the fan motor. Typically, a control circuit outputs a pulse width modulated signal for switching the power supply to the fan motor so that the power supply to the fan motor is pulse width modulated. The control circuit also measures the speed of the fan by monitoring a tachometer signal received from the fan motor. However, one problem with such fan control is that in general the tachometer signal from the fan motor is only available when the duty cycle of the pulse width modulated power supply to the fan motor is in the on state. Thus, the tachometer signal read over one or more duty cycles is not an accurate representation of the fan speed.

Due to the relatively high heat output of some central processing units and power supply modules, it is essential that the cooling fans should operate at a speed which is at least up to the speed at which they are set to operate, and which is determined by the mark/space ratio of the duty cycle of the pulse width modulated power supply. An under-speed in a fan can have serious consequences including failure and destruction of components within the computer cabinetry. It is therefore essential that under-speed in a fan can be accurately detected and determined.

The present invention is directed towards providing a method and apparatus for determining a value of a performance characteristic of a fan, such as for example fan speed.

SUMMARY OF THE INVENTION

According to the invention there is provided a method for determining a value of a performance characteristic of a fan driven by a motor powered by a pulse width modulated power supply in which a monitoring means associated with the fan outputs a signal indicative of the value of the performance characteristic to be monitored and the monitoring means is powered by the pulse width modulated power supply, the method comprising the steps of:

reading a predetermined portion of the signal from the monitoring means during a period of a duty cycle of the pulse width modulated power supply when the power supply during the duty cycle is in the on state for powering the fan motor, holding the power supply in the on state during the duty cycle while the predetermined portion of the monitoring means signal is being read, and determining the value of the performance characteristic from the read predetermined portion of the monitoring means signal.

In one embodiment of the invention the off period of the next duty cycle of the power supply to the fan motor is commenced in response to the predetermined portion of the monitoring means signal having been read, in the event that the power supply had been held in the on state longer than the normal on period of the duty cycle.

In another embodiment of the invention the performance characteristic to be determined is the fan speed, and the monitoring means outputs a pulsed signal indicative of the fan speed, and a predetermined number of sequential pulses of the pulsed signal are read, and the time period during the predetermined number of sequential pulses of the pulsed signal is determined for determining the time period of one revolution of the fan motor.

In a further embodiment of the invention the predetermined number of sequential pulses of the pulsed signal from the monitoring means which are read is at least two sequential pulses. Preferably, the predetermined number of sequential pulses of the pulsed signal from the monitoring means which are read is at least three sequential pulses.

In one embodiment of the invention the time period during the predetermined number of sequential pulses of the pulsed signal from the monitoring means which are read is determined by counting the number of clock pulses in a reference clock signal during the time period for the predetermined number of sequential pulses. Preferably, the number of clock pulses of the reference clock signal are counted from an edge of the first of the sequential pulses of the pulsed signal to a corresponding edge of the last of the sequential pulses of the predetermined number of sequential pulses for determining the time period during the predetermined number of sequential pulses of the pulsed signal from the monitoring means.

In one embodiment of the invention the pulsed signal from the monitoring means is derived by monitoring the current through the fan.

Preferably, the value of the performance characteristic determined from the signal from the monitoring means is compared with a reference value of the performance characteristic at which the fan should have been performing in response to the duty cycle of the pulse width modulated power supply for determining if the fan is operating at the reference performance characteristic value, and an alert signal is issued in the event that the determined value does not comparing favourably with the reference value of the performance characteristic. Advantageously, the alert signal is issued in the event of the determined value of the performance characteristic being less than the reference value of the performance characteristic.

In one embodiment of the invention the method according to the invention is for monitoring the fan speed of a cooling fan located in an enclosure for electronic circuitry.

Additionally, the invention provides apparatus for determining a value of a performance characteristic of a fan driven by a motor powered by a pulse width modulated power supply in which a monitoring means associated with the fan outputs a signal indicative of the value of the performance characteristic to be monitored, and the monitoring means is powered by the pulse width modulated power supply, the apparatus comprising:

a means for reading a predetermined portion of the signal from the monitoring means during a period of a duty cycle of the pulse width modulated power supply when the power supply during the duty cycle is in the on state, for powering the fan motor, a control means for holding the power supply in the on state during the duty cycle while the predetermined portion of the monitoring means signal is being read, and a means for determining the value of the performance characteristic from the read predetermined portion of the monitoring means signal.

In one embodiment of the invention the control means holds the power supply in the on state during the duty cycle in response to the reading means commencing to read the monitoring means signal.

In another embodiment of the invention the control means is responsive to the predetermined portion of the monitoring means signal having been read for commencing the off period of the next duty cycle of the power supply to the fan in the event that the power supply had been held in the on state for a period longer than the normal on period of the duty cycle.

In a further embodiment of the invention the performance characteristic to be determined is the fan speed, and the monitoring means outputs a pulsed signal indicative of the fan speed, and the reading means reads a predetermined number of sequential pulses of the pulsed signal, and a computing means determines the time period during the predetermined number of sequential pulses of the pulsed signal for determining the time period of one revolution of the fan motor.

In one embodiment of the invention the predetermined number of sequential pulses of the pulsed signals from the monitoring means read by the reading means is at least two sequential pulses. Preferably, the predetermined number of sequential pulses of the pulsed signal from the monitoring means read by the reading means is at least three sequential pulses.

In a further embodiment of the invention the computing means for determining the time period during the predetermined number of sequential pulses from the monitoring means comprises a counting means for counting the number of clock pulses of a reference clock signal during the time period for the predetermined number of sequential pulses of the pulsed signal from the monitoring means.

In one embodiment of the invention the counting means counts the number of clock pulses of the reference clock signal from an edge of the first of the sequential pulses of the pulsed signal to a corresponding edge of the last of the sequential pulses of the predetermined number of sequential pulses of the pulsed signal from the monitoring means.

Advantageously, the reading means is responsive to at least one pulse of the pulsed signal from the monitoring means having been received after commencement of the on period of the duty cycle of the pulse width modulated power supply prior to commencing timing of the predetermined number of sequential pulses.

Preferably, the reading means is responsive to the second pulse of the pulsed signal from the monitoring means having been received after the commencement of the on period of the duty cycle of the pulse width modulated power supply for commencing timing of the predetermined number of sequential pulses.

In one embodiment of the invention a comparing means is provided for comparing the value of the performance characteristic determined from the signals from the monitoring means with a reference value of the performance characteristic at which the fan should have been performing in response to the duty cycle of the pulse width modulated power supply for determining if the fan is operating at the reference performance characteristic value, and a means for outputting an alert signal is also provided which is responsive to the comparing means determining that the determined value of the performance characteristic does not compare favourably with the reference value of the performance characteristic. Preferably, the alerting means is responsive to the comparing means determining that the determined value of the performance characteristic is less than the reference value of the performance characteristic.

In a further embodiment of the invention the apparatus further comprising the monitoring means, and the pulsed signal outputted by the monitoring means is derived by the monitoring means from the current through the fan motor.

In one embodiment of the invention the monitoring means comprises a monitoring resistor in series with the fan motor, and the pulsed signal is a pulsed voltage signal developed across the monitoring resistor resulting from spikes in the current through the fan motor.

In another embodiment of the invention the monitoring resistor is coupled to the reading means by a coupling capacitor.

In a still further embodiment of the invention the apparatus is for monitoring the fan speed of a cooling fan located in an enclosure for electronic circuitry.

ADVANTAGES OF THE INVENTION

The advantages of the invention are many. By virtue of the fact that the power supply to the fan motor is held in the on state during a duty cycle of the pulse width modulated power supply while the predetermined portion of the signal from the monitoring means is being read, the value of the performance characteristic being determined can be determined as accurately as possible. This is due to the fact that the signal from the monitoring means gives a representation of the value of the characteristic which is as accurate as possible, since the monitoring means remains powered continuously during the period while the signal from the monitoring means is being read. Additionally, by holding the power supply in the on state during the duty cycle of the pulse width modulated power supply while the predetermined portion of the monitoring means signal is being read, allows the fan to be operated and the fan speed to be determined by a two wire system remotely or otherwise, assuming a common ground is provided. All that is required is one wire for modulating the width of the pulse width modulated power supply to the fan motor, and a second wire for receiving the signal from the monitoring means. Additionally, the method and apparatus according to the invention provides a relatively simple and straightforward method and apparatus for accurately determining a value of a characteristic of a fan where both the fan and the monitoring means are powered by the same pulse width modulated power supply. The method and apparatus are particularly suitable for controlling the operation and determining the speed of a cooling fan in an electronic enclosure, for example, a computer cabinet for cooling components within the computer cabinet. Additionally, by virtue of the fact that the fan can be operated and the fan speed can be determined by the use of two wires only, the method and apparatus requires minimum additional circuitry.

The invention will be more clearly understood from the following description of a preferred embodiment thereof which is given by way of example only with reference to the accompanying drawings.

DETAILED DESCRIPTION OF THE INVENTION

Figure 1:
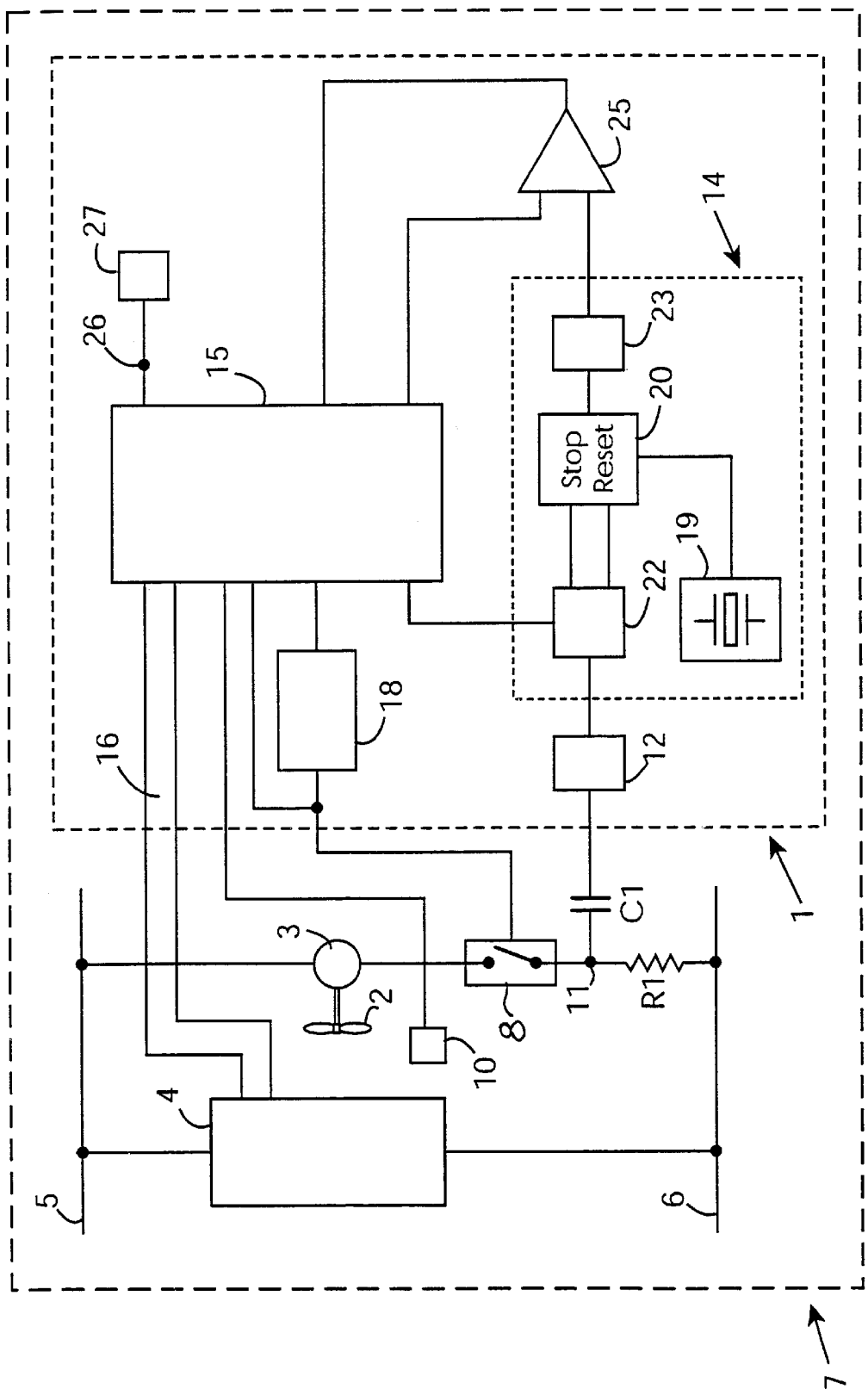
FIG. 1 is a block representation of a circuit of apparatus according to the invention for operating a fan and for monitoring and determining the fan speed.

Referring to the drawings there is illustrated apparatus according to the invention provided by an operating circuit indicated generally by the reference numeral 1 for operating a fan 2 driven by a DC fan motor 3, and for determining a performance characteristic, in this case the speed of the fan 2. In this particular embodiment of the invention the fan 2 and fan motor 3 are provided for cooling a component in an electronic enclosure, namely, a central processing unit 4 in a computer cabinet, such as in a PC cabinet illustrated by the broken lines 7. The fan motor 3 is powered by a DC power supply on power supply rails, namely, a positive rail 5 and a ground rail 6 through a switch means, namely, a switching circuit 8 which is operated under the control of the operating circuit 1 for pulse width modulating the power supply to the fan motor 3, for varying the speed of the fan motor 3. The waveform (a) of FIG. 3 illustrates a typical waveform of a pulse width modulated power supply to the fan motor 3. The speed of the fan motor 3 is varied by modulating the power supply delivered to the fan motor 3 by controlling the switching circuit 8 for varying the mark/space ratio of the power supply to the fan motor 3. The speed of the fan motor 3 is increased by increasing the mark/space ratio of the pulse width modulated power supply, and is decreased by reducing the mark/space ratio. A temperature sensor 10 is located in the cabinet 7 adjacent the central processing unit 4 for monitoring the temperature of the central processing unit 4 within the cabinet 7. The temperature sensor 10 is read by the operating circuit 1, and the speed of the fan motor 3 is appropriately varied in response to the monitored temperature.

A monitoring means for monitoring the speed of the fan motor 3 and in turn the speed of the fan 2 comprises a monitoring resistor R1 which is connected in series with the fan motor 3 and the switching circuit 8 between the rails 5 and 6. In this embodiment of the invention the fan motor 3 is of the type which does not draw uniform constant current throughout each revolution, rather, a spike appears in the current drawn by the fan motor 3 one or more times during each revolution of the fan motor. Where more than one spike occurs in each revolution the spikes are at equi-spaced angular intervals during each revolution. In this particular embodiment of the invention four spikes occur in the current drawn during each revolution, namely, at 90° intervals of each revolution. The spikes are caused by momentary reductions in the current drawn. The spike current being drawn by the fan motor flows through the monitoring resistor R1, and thus causes corresponding spike changes in the voltage developed across the monitoring resistor R1 which can be detected at a node 11 between the switching circuit 8 and the resistor R1. The voltage developed across the resistor R1 is illustrated by the waveform (b) of FIG. 2. The voltage signal appearing at the node 11 is fed through a coupling capacitor C1 to a reconstructing circuit 12 where it is reconstructed into a square wave tachometer signal as illustrated by the waveform (c) of FIG. 2. Each alternate spike of the waveform (b) causes a rising edge in the square wave tachometer signal (c), while each other alternate spike of the waveform (b) causes a falling edge in the square wave tachometer signal (c). Analysing circuitry 14 in the operating circuit 1 receives the tachometer signal (c) from the reconstructing circuit 12 from which the fan speed is determined. In determining the fan speed the analysing circuit 14 determines the time period of one revolution of the fan motor 3 from the tachometer signal (c) outputted by the circuit 12 as will be described below. Because current flows through the monitoring resistor R1 only during the periods of each duty cycle of the pulse width modulated power supply when the power supply is in the on state, the tachometer signal (c) from the circuit 12 is similarly only available during the on period of each duty cycle. Accordingly, to ensure the accuracy of the determined fan motor speed, the duty cycle of the pulse width modulated power supply is held in the on state by the operating circuit 1 as will be described below for a period sufficient to allow an appropriate number of pulses of the tachometer signal from the circuit 12 to be read.

The operating circuit 1 comprises a control means, namely, a control circuit 15 which controls the operation of the operating circuit 1. The control circuit 15 comprises memory registers and intelligence for operating the switching circuit 8 during monitoring of the tachometer signal and also for determining the speed of the fan motor 3, as well as for determining if the fan motor is operating under speed. A communicating bus 16 communicates the control circuit 15 with the central processing unit 4 for controlling the control circuit 15 for operating the fan motor 3 at the desired or appropriate speed. A variable output signal generator circuit 18 outputs a variable pulse width modulated signal under the control of the control circuit 15 for switching the switching circuit 8 for in turn modulating the DC power supply to the fan motor 3 to provide a correspondingly pulse width modulated power supply to the fan motor 3 for operating the fan motor 3 at the desired fan speed. The duty cycle of the signal outputted by the variable signal generator 18 is variable over a wide range of duty cycles. The control circuit 15 reads signals from the temperature sensor 10 for determining the temperature of the central processing unit 4 in the cabinet 7, and under the control of the central processing unit 4 selects the appropriate duty cycle of the pulse width modulated signal to be outputted by the signal generator circuit 18 in response to the temperature in the cabinet.

Figure 2:
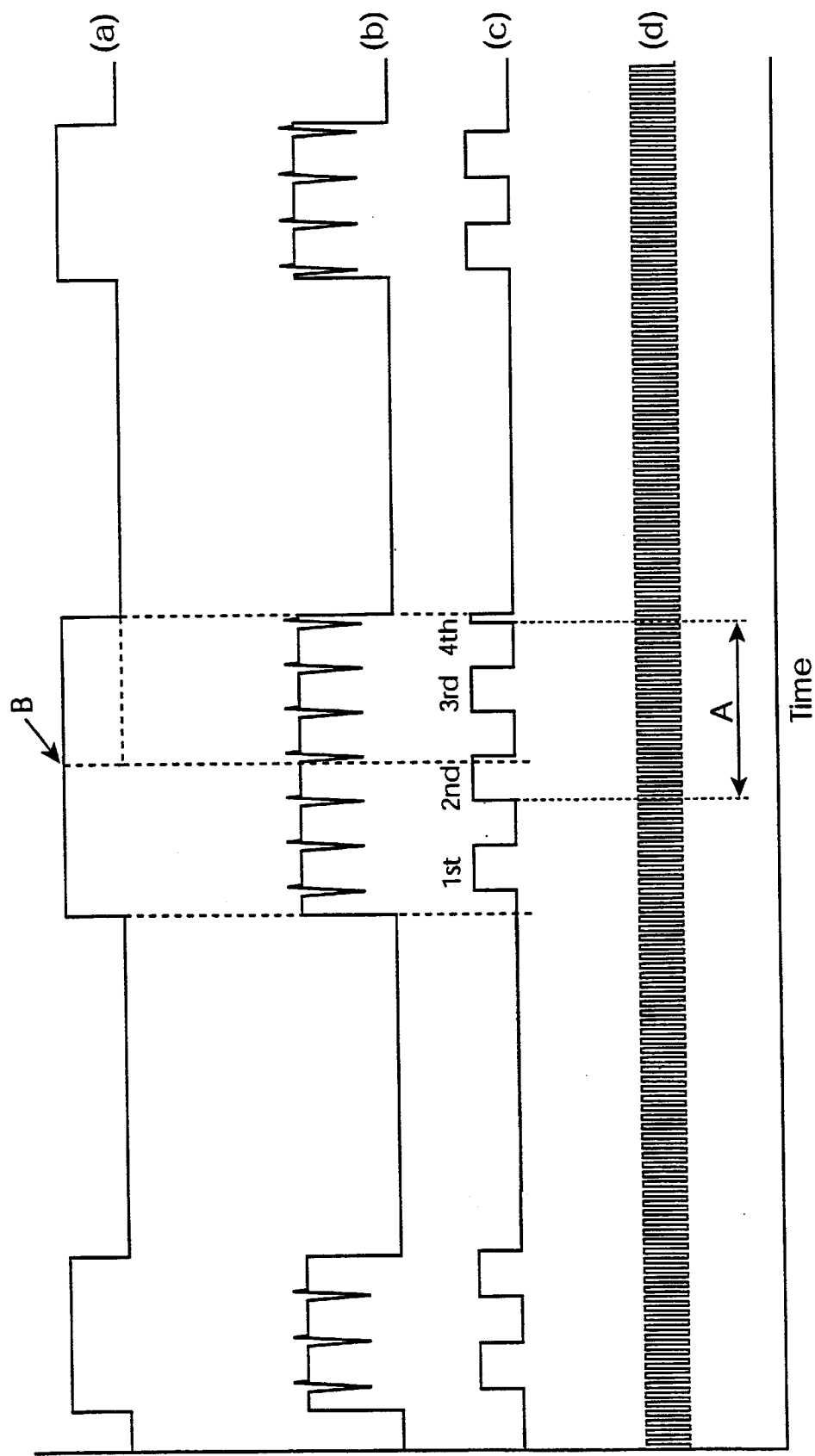
FIG. 2 is a representation of signals generated and analysed by the circuit of FIG. 1.

A clock signal generating circuit 19 generates a reference clock signal which is fed to a counting means, namely, a counter 20, see the waveform (d) of FIG. 2. A gate circuit 22 under the control of the control circuit 15 selectively gates the tachometer signal to the counter 20 for operating the counter 20 to count the number of clock signals during three sequential pulses of the tachometer signal (c), in other words, during the period A, see FIG. 2. This has the same effect as timing the three sequential pulses during the period A. The control circuit 15 reads the output from the signal generator circuit 18 for detecting the on periods of the duty cycle of the power supply to fan motor 3 in which fan speed is to be determined. The control circuit 15 counts the pulses of the tachometer signal entering the gate circuit 22 after the commencement of the on period of the duty cycle. On the rising edge of the second pulse of the tachometer signal, see FIG. 2 after the commencement of the on period of the duty cycle of the power supply, the control circuit 15 operates the gate circuit 22 for outputting the tachometer signal to the reset pin of the counter 20 for causing the counter 20 to commence counting, see FIG. 2. On the rising edge of the fourth pulse of the tachometer signal the control circuit 15 operates the gate circuit 22 for outputting the tachometer signal to the stop pin of the counter 20 to stop the count. A register 23 stores the count of clock cycles from the counter 20, which corresponds to the time of the period A from the rising edge of the second pulse to the rising edge of the fourth pulse of the tachometer signal.

In this particular case the duty cycle of the power supply to the fan motor 3 was due to have gone into the off state at B during the second pulse of the tachometer signal, see FIG. 2. However, in order to allow an accurate determination of the fan motor speed, the control circuit 15 operates the signal generator 18 to hold the duty cycle in the on state until the rising edge of the fourth pulse has been detected. As soon as the rising edge of the fourth pulse has been detected the control circuit 15 operates the signal generator 18 for commencing the off period of the next duty cycle which in turn causes the tachometer signal to disappear until the next on period.

A comparator 25 compares the count stored in the register 23 with a reference count stored in the control circuit 15 which corresponds to the count corresponding to the speed at which the fan motor should be operating. In the event that the count stored in the register 23 is higher than the reference count indicating under-speed of the fan, the comparator 25 outputs an alert signal which is fed back to the control circuit 15 which in turn outputs an alert signal on an output 26 which may be fed to an alarm 27 which may be an audio or visual alarm for indicating under-speed of the fan motor.

Because of the fact that in general, one is only concerned with an over temperature condition existing in a computer cabinet, in this embodiment of the invention an alert signal is only outputted from the control circuit 1 in the event of under-speed of the fan motor 3. However, if desired over speed of the fan motor could also be determined by inserting one additional comparator. This should be advantageous if it were desired to avoid an over-speed condition occurring in the fan in order to minimise fan noise.

Apart from the fact that the method and apparatus according to the invention provides for relatively accurate monitoring of the fan motor speed, and in turn the fan speed, the effect of the monitoring method on the fan motor speed is minimal, since as soon as the time period for the appropriate number of pulses from the tachometer signal has been determined the duty cycle of the pulse width modulated power supply returns to normal, and furthermore, the off period of the next duty cycle commences immediately the time period for the appropriate number of pulses of the tachometer signal has been determined. Typically, the fan speed would be monitored once per second, and in cases where a duty cycle is approximately 20 mSecs, monitoring would only occur once every fifty duty cycles.

Needless to say, in the event that the time period of the appropriate number of pulses of the tachometer signal can be determined during the normal on period of a duty cycle of the power supply to the fan motor, it will not be necessary to hold the duty cycle on beyond the normal on period of the duty cycle during monitoring of the fan speed, and furthermore, in such cases the on period of the duty cycle will not be interfered with.

While three sequential pulses of the tachometer signal have been selected for determining the fan motor speed, any suitable number of sequential pulses may be selected.

What is claimed is:

1. A method for determining the speed of a fan driven by a motor powered by a pulse width modulated power supply in which a monitoring means associated with the fan outputs a signal indicative of the fan speed and the monitoring means is powered by the pulse width modulated power supply, the method comprising the steps of:
   reading a predetermined portion of the signal from the monitoring means during a period of a duty cycle of the pulse width modulated power supply when the power supply during the duty cycle is in the on state for powering the fan motor,
   holding the power supply in the on state during the duty cycle while the predetermined portion of the monitoring means signal is being read, and
   determining the fan speed from the read predetermined portion of the monitoring means signal.

2. A method as claimed in claim 1 in which the off period of the next duty cycle of the power supply to the fan motor is commenced in response to the predetermined portion of the monitoring means signal having been read, in the event that the power supply had been held in the on state longer than the normal on period of the duty cycle.

3. A method as claimed in claim 1 in which the monitoring means outputs a pulsed signal indicative of the fan speed, and a predetermined number of sequential pulses of the pulsed signal are read, and the time period during the predetermined number of sequential pulses of the pulsed signal is determined for determining the time period of one revolution of the fan motor.

4. A method as claimed in claim 3 in which the predetermined number of sequential pulses of the pulsed signal from the monitoring means which are read is at least two sequential pulses.

5. A method as claimed in claim 3 in which the predetermined number of sequential pulses of the pulsed signal from the monitoring means which are read is at least three sequential pulses.

6. A method as claimed in claim 3 in which the time period during the predetermined number of sequential pulses of the pulsed signal from the monitoring means which are read is determined by counting the number of clock pulses in a reference clock signal during the time period for the predetermined number of sequential pulses.

7. A method as claimed in claim 6 in which the number of clock pulses of the reference clock signal are counted from an edge of the first of the sequential pulses of the pulsed signal to a corresponding edge of the last of the sequential pulses of the predetermined number of sequential pulses for determining the time period during the predetermined number of sequential pulses of the pulsed signal from the monitoring means.

8. A method as claimed in claim 3 in which the pulsed signal from the monitoring means is derived by monitoring the current through the fan.

9. A method as claimed in claim 1 in which the fan speed determined from the signal from the monitoring means is compared with a reference value of fan speed at which the fan should have been performing in response to the duty cycle of the pulse width modulated power supply for determining if the fan is operating at the reference value of fan speed, and an alert signal is issued in the event that the determined fan speed does not comparing favourably with the reference value of fan speed.

10. A method as claimed in claim 9 in which the alert signal is issued in the event of the determined fan speed being less than the reference value of fan speed.

11. A method as claimed in claim 1 for monitoring the fan speed of a cooling fan located in an enclosure for electronic circuitry.

12. The method of claim 1 wherein the monitoring means is a monitoring resistor.

13. Apparatus for determining the speed of a fan driven by a motor powered by a pulse width modulated power supply in which a monitoring means associated with the fan outputs a signal indicative of the fan speed, and the monitoring means is powered by the pulse width modulated power supply, the apparatus comprising:
- a means for reading a predetermined portion of the signal from the monitoring means during a period of a duty cycle of the pulse width modulated power supply when the power supply during the duty cycle is in the on state, for powering the fan motor,
- a control means for holding the power supply in the on state during the duty cycle while the predetermined portion of the monitoring means signal is being read, and
- a means for determining the fan speed from the read predetermined portion of the monitoring means signal.

14. Apparatus as claimed in claim 13 in which the control means holds the power supply in the on state during the duty cycle in response to the reading means commencing to read the monitoring means signal.

15. Apparatus as claimed in claim 13 in which the control means is responsive to the predetermined portion of the monitoring means signal having been read for commencing the off period of the next duty cycle of the power supply to the fan in the event that the power supply had been held in the on state for a period longer than the normal on period of the duty cycle.

16. Apparatus as claimed in claim 13 in which the monitoring means outputs a pulsed signal indicative of the fan speed, and the reading means reads a predetermined number of sequential pulses of the pulsed signal, and a computing means determines the time period during the predetermined number of sequential pulses of the pulsed signal for determining the time period of one revolution of the fan motor.

17. Apparatus as claimed in claim 16 in which the predetermined number of sequential pulses of the pulsed signals from the monitoring means read by the reading means is at least two sequential pulses.

18. Apparatus as claimed in claim 16 in which the predetermined number of sequential pulses of the pulsed signal from the monitoring means read by the reading means is at least three sequential pulses.

19. Apparatus as claimed in claim 20 in which the computing means for determining the time period during the predetermined number of sequential pulses from the monitoring means comprises a counting means for counting the number of clock pulses of a reference clock signal during the time period for the predetermined number of sequential pulses of the pulsed signal from the monitoring means.

20. Apparatus as claimed in claim 19 in which the counting means counts the number of clock pulses of the reference clock signal from an edge of the first of the sequential pulses of the pulsed signal to a corresponding edge of the last of the sequential pulses of the predetermined number of sequential pulses of the pulsed signal from the monitoring means.

21. Apparatus as claimed in claim 16 in which the reading means is responsive to at least one pulse of the pulsed signal from the monitoring means having been received after commencement of the on period of the duty cycle of the pulse width modulated power supply prior to commencing timing of the predetermined number of sequential pulses.

22. Apparatus as claimed in claim 21 in which the reading means is responsive to the second pulse of the pulsed signal from the monitoring means having been received after the commencement of the on period of the duty cycle of the pulse width modulated power supply for commencing timing of the predetermined number of sequential pulses.

23. Apparatus as claimed in claim 13 in which a comparing means is provided for comparing the fan speed determined from the signals from the monitoring means with a reference value of fan speed at which the fan should have been performing in response to the duty cycle of the pulse width modulated power supply for determining if the fan is operating at the reference fan speed value, and a means for outputting an alert signal is also provided which is responsive to the comparing means determining that the determined value of the fan speed does not compare favourably with the reference value of fan speed.

24. Apparatus as claimed in claim 23 in which the alerting means is responsive to the comparing means determining that the determined fan speed is less than the reference value of fan speed.

25. Apparatus as claimed in claim 16 further comprising the monitoring means, and the pulsed signal outputted by the monitoring means is derived by the monitoring means from the current through the fan motor.

26. Apparatus as claimed in claim 25 in which the monitoring means comprises a monitoring resistor in series with the fan motor, and the pulsed signal is a pulsed voltage signal developed across the monitoring resistor resulting from spikes in the current through the fan motor.

27. Apparatus as claimed in claim 26 in which the monitoring resistor is coupled to the reading means by a coupling capacitor.

28. Apparatus as claimed in claim 13 for monitoring the fan speed of a cooling fan located in an enclosure for electronic circuitry.

29. Apparatus for determining the speed of a fan driven by a motor powered by a pulse width modulated power supply in which a monitoring resistor associated with the fan outputs a signal indicative of the fan speed, and the monitoring resistor is powered by the pulse width modulated power supply, the apparatus comprising:
- an analyzing circuit operatively connected to read a predetermined portion of the signal from the monitoring resistor during a period of a duty cycle of the pulse width modulated power supply when the power supply during the duty cycle is in the on state, and determining the fan speed from the read predetermined portion of the signal from the monitoring resistor, and
- a control circuit configured and arranged to hold the power supply in the on state during the duty cycle while the predetermined portion of the signal from the monitoring resistor is being read.

30. The apparatus of claim 29, wherein the control circuit holds the power supply in the on state during the duty cycle in response to commencement of reading of the signal from the monitoring resistor.

31. The apparatus of claim 29 wherein the control circuit is responsive to the predetermined portion of the signal from the monitoring resistor having been read for commencing the off period of the next duty cycle of the power supply to the fan in the event that the power supply had been held in the on state for a period longer than the normal period of the duty cycle.

32. The apparatus of claim 29 wherein the monitoring resistor outputs a pulsed signal indicative of the fan speed, and the analyzing circuit reads a predetermined number of sequential pulses of the pulsed signal, and determines the time period during the predetermined number of sequential pulses of the pulsed signal for determining the time period of one revolution of the fan motor.

33. The apparatus of claim 32 in which the predetermined number of sequential pulses of the pulsed signals from the monitoring resistor read by the analyzing circuit is at least two sequential pulses.

34. The apparatus of claim 32 in which the predetermined number of sequential pulses of the pulsed signal from the monitoring resistor read by the analyzing circuit is at least three sequential pulses.

35. The apparatus of claim 32 wherein the analyzing circuit comprises a counter which counts the number of clock pulses of a reference clock signal during the time period for the predetermined number of sequential pulses of the pulsed signal from the monitoring resistor for use in determining the time period during the predetermined number of sequential Pulses from the monitoring resistor.

36. The apparatus of claim 35 wherein the counter counts the number of clock pulses of the reference clock signal from an edge of the first of the sequential pulses of the pulsed signal to a corresponding edge of the last of the sequential pulses of the predetermined number of sequential pulses of the pulsed signal from the monitoring resistor.

37. The apparatus of claim 32 wherein the analyzing circuit is responsive to at least one pulse of the pulsed signal from the monitoring resistor having been received after commencement of the on period of the duty cycle of the pulse width modulated power supply prior to commencing timing of the predetermined number of sequential pulses.

38. The apparatus of claim 37 wherein the analyzing circuit is responsive to the second pulse of the pulsed signal from the monitoring resistor having been received after the commencement of the on period of the duty cycle of the pulse width modulated power supply for commencing timing of the predetermined number of sequential pulses.

39. The apparatus of claim 29 wherein a comparator is provided which compares the fan speed determined from the signals from the monitoring resistor with a reference value of fan speed at which the fan should have been performing in response to the duty cycle of the pulse width modulated power supply for determining if the fan is operating at the reference fan speed value, and the control circuit is responsive to the comparator determining that the determined value of the fan speed does not compare favorably with the reference value of fan speed for outputting an alert signal.

40. The apparatus of claim 39 in which the control circuit responds to the comparator determining that the determined fan speed is less than the reference value of fan speed for outputting the alert signal.

41. The apparatus of claim 32 further comprising the pulsed signal outputted by the monitoring resistor being derived by the monitoring resistor from the current through the fan motor.

42. The apparatus of claim 41 wherein the monitoring resistor is in series with the fan motor, and the pulsed signal is a pulsed voltage signal developed across the monitoring resistor resulting from spikes in the current through the fan motor.

43. The apparatus of claim 42 wherein the monitoring resistor is coupled to the analyzing circuit by a coupling capacitor.

* * * * *